US011110876B2

(12) United States Patent
Escobar

(10) Patent No.: US 11,110,876 B2
(45) Date of Patent: Sep. 7, 2021

(54) CARSEAT ADJUSTMENT STRAP SENSOR

(71) Applicant: Jeremy R. Escobar, Waxahachie, TX (US)

(72) Inventor: Jeremy R. Escobar, Waxahachie, TX (US)

( * ) Notice: Subject to any disclaimer, the term of this patent is extended or adjusted under 35 U.S.C. 154(b) by 0 days.

(21) Appl. No.: 16/540,282

(22) Filed: Aug. 14, 2019

(65) Prior Publication Data

US 2020/0055478 A1    Feb. 20, 2020

Related U.S. Application Data

(60) Provisional application No. 62/718,400, filed on Aug. 14, 2018.

(51) Int. Cl.
*B60R 21/015* (2006.01)
*H01L 27/15* (2006.01)
*B60R 22/48* (2006.01)
*F21Y 115/10* (2016.01)

(52) U.S. Cl.
CPC .......... *B60R 21/0155* (2014.10); *B60R 22/48* (2013.01); *H01L 27/153* (2013.01); *F21Y 2115/10* (2016.08)

(58) Field of Classification Search
CPC ................ B60R 21/0155; B60R 22/48; B60R 22/105; B60R 22/12; H01L 27/153; F21Y 2115/10
See application file for complete search history.

(56) References Cited

U.S. PATENT DOCUMENTS

| 2005/0040960 A1* | 2/2005 | Knox | B60R 22/48 340/668 |
| 2006/0057900 A1* | 3/2006 | Lawrence | B60R 22/48 439/824 |
| 2009/0234542 A1* | 9/2009 | Orlewski | B60R 21/01546 701/45 |
| 2010/0140997 A1* | 6/2010 | Biaud | B60N 2/2812 297/250.1 |
| 2014/0052342 A1* | 2/2014 | Seibert | B60N 2/002 701/45 |
| 2016/0207497 A1* | 7/2016 | Seal | B60N 2/2893 |
| 2016/0304004 A1* | 10/2016 | Sandbothe | B60N 2/2851 |
| 2017/0305340 A1* | 10/2017 | Rose | B60N 2/28 |
| 2018/0354443 A1* | 12/2018 | Ebrahimi | B60N 2/2812 |

* cited by examiner

*Primary Examiner* — Kevin Quarterman
(74) *Attorney, Agent, or Firm* — Wilson Daniel Swayze, Jr.

(57) ABSTRACT

The present invention discloses a seatbelt strap sensor for automobiles. The seatbelt strap sensor could detachably fasten to a strap of a seatbelt of the automobile. The strap sensor comprises a plurality of LEDs disposed within a housing, and a pressure sensor and a bracket are disposed on the rear surface of the housing. The pressure sensor is positioned against the body of a child and configured to measure the tightness of the strap of a seatbelt. The bracket has capable to tightly hold the strap sensor to the strap of the seatbelt. The LEDs are configured to illuminate different colors for indicating the tightness of the strap based on the output of the pressure sensor. The housing having indications with letters or words and symbols corresponding to the LEDs. It helps users to determine the tightness of the strap and could be adjusted optimally.

15 Claims, 6 Drawing Sheets

CARSEAT ADJUSTMENT STRAP SENSOR

BACKGROUND OF THE INVENTION

A. Technical Field

The present invention generally relates to a seatbelt or a harness strap sensor. More specifically, the present invention relates to a seatbelt or a harness strap sensor fastened to a strap of a seatbelt in automobiles and provide safety for driver, occupants or children traveled in automobiles.

B. Description of Related Art

Automobile has been slowly evolving over the decades since it was introduced to the public and became the primary mode of transportation for individuals and families. In the beginning, very little attention was paid to the safety of a driver, occupants and children travelled in the automobiles. In the present scenario, the installation of seatbelts or harnesses in automobiles has become mandatory by law. The purpose of the seatbelt in the automobile is, to reduce personal injury resulting from automobile accidents.

In order to be effective, the seatbelt or harness having straps sufficiently tight in order to hold the driver, occupants or children according to size, corpulence, and clothing, etc., in such a way as to limit the movements of the body in the event of an impact.

If the tension of the strap is insufficient and loose, the child could fall from the seat while turning the automobile and the child could not be safe in the event of impact. If the straps of the seatbelt tighten excessively, which can result in discomfort for the child. Currently, the parent or caregiver has to use the pinch test to determine the looseness or tightness of the child's car seat harness or slips a finger under the strap and empirically estimates the tightness. Either of these methods is a guesstimate at best and with the safety of the child at risk, it can be a real worrisome adjustment. Failure to get the strap tightness precise can result is an uncomfortable ride for the child if the straps are too tight, or if the straps are too loose, a chance that they might slip out from under the harness and not be restrained if a violent maneuver is required or a crash occurs.

Henceforth, it is desirable to provide a seatbelt strap sensor in automobiles for providing safety to the children and resolves most of the problems by accurately measuring the tightness or tension of the strap. It is desirable to provide a seatbelt strap sensor to allow parents or a caregiver to optimally adjust the strap for comfort and safety of the children. It is also desirable to provide a seatbelt strap sensor to indicate the tension accurately in the strap and in order to limit the movements of the body in the event of impact and avoid personal injury resulting from automobile accidents.

SUMMARY OF THE INVENTION

The present invention generally discloses a seatbelt or a harness strap sensor. Further, the present invention relates to a seatbelt or a harness strap sensor fastened to a strap in automobiles and provide safety for driver, occupants, and children traveled in automobiles.

According to the present invention, the seatbelt strap sensor detachably fastened to a strap of a seatbelt in the automobile. The seatbelt strap sensor comprises a body and a plurality of light emitting diodes (LEDs). In one embodiment, the housing of the seatbelt strap sensor is injection molded from, but not limited to, an acrylonitrile butadiene styrene (ABS) polycarbonate plastic. In one embodiment, the housing is molded in two sections. In one embodiment, the housing comprises a front surface and a rear surface. The front surface could have one or more apertures to project the LEDs out towards the front seat, which increases the visibility to users. In one embodiment, the two sections of the housing are fastened via an adhesive. In another embodiment, the two sections of the housing are fastened via a fastener. In one embodiment, the fastener could be stainless-steel fasteners.

In one embodiment, the plurality of LEDs having several colors configured to deliver information to the user on the tightness of the strap of the seatbelt. In one embodiment, the colors of the plurality of LEDs could be, but not limited to, an amber, a green, and a red color. In one embodiment, the plurality of LEDs is disposed within the housing of the seatbelt strap sensor. In one embodiment, the plurality of LEDs is arranged in each corresponding position. In another embodiment, the plurality of LEDs could be positioned in a row within the housing of the seatbelt strap sensor.

In one embodiment, the seatbelt strap sensor comprises a pressure sensor or metal foil strain gauge and a bracket on the rear surface of the housing. In one embodiment, the pressure sensor could be disposed on the surface of the bracket. The pressure sensor is positioned against the body of the child. In one embodiment, the pressure sensor is configured to measure the tightness or tension of the strap of the seatbelt. In one embodiment, the bracket is disposed at the one side of the housing via, but not limited to, an adhesive or any other fastener. In one embodiment, the bracket is configured to tightly hold the seatbelt strap sensor to the strap of the seatbelt. In one embodiment, the bracket could be, but not limited to, a clamp, and a clip.

In one embodiment, the housing having indications with letters or words and symbols corresponding to the LEDs. In one embodiment, the letters or words and symbols are screen printed on the front surface of the housing and helps users to determine the tightness or tension of the strap of the seatbelt. In an exemplary embodiment, if the tightness or tension of the strap is low, one of the LEDs will illuminate in the red color to indicate insufficient tightness. If the tightness or tension of the strap is high, another LED will illuminate in the amber color to indicate excessive tightness. If the tightness or tension of the strap is enough, another LED will illuminate in the green color to indicate good tightness.

In one embodiment, the seatbelt strap sensor further comprises at least one power source. In one embodiment, the power source is disposed within the housing. The power source is configured to power the LEDs and electronic components, which are disposed within the housing of the seatbelt strap sensor. In one embodiment, the power source could be a battery, a fuel cell, and a solar cell. In one embodiment, the power source could be placed inside the housing via an access provided at the bottom of the housing. In one embodiment, a printed circuit board (PCB) for the seatbelt strap sensor is fabricated to the final assembler's requirements. The circuit board is designed to have all the components oriented so they can be mounted with the LED illuminators projecting out of the lenses via one or more apertures mounted on the front surface of the housings.

In one embodiment, the seatbelt strap sensor further comprises a switch. In one embodiment, the switch is configured to switch from ON to OFF state and vice versa. In another embodiment, the seatbelt strap sensor could be fastened to a plurality of straps for accurately adjusting the tension or tightness of the straps and to provide more comfort to the child.

Other objects, features and advantages of the present invention will become apparent from the following detailed description. It should be understood, however, that the detailed description and the specific examples, while indicating specific embodiments of the invention, are given by way of illustration only, since various changes and modifications within the spirit and scope of the invention will become apparent to those skilled in the art from this detailed description.

BRIEF DESCRIPTION OF DRAWINGS

The foregoing summary, as well as the following detailed description of the invention, is better understood when read in conjunction with the appended drawings. For the purpose of illustrating the invention, exemplary constructions of the invention are shown in the drawings. However, the invention is not limited to the specific methods and structures disclosed herein. The description of a method step or a structure referenced by a numeral in a drawing is applicable to the description of that method step or structure shown by that same numeral in any subsequent drawing herein.

DETAILED DESCRIPTION OF EMBODIMENTS

A description of embodiments of the present invention will now be given with reference to the Figures. It is expected that the present invention may be embodied in other specific forms without departing from its spirit or essential characteristics. The described embodiments are to be considered in all respects only as illustrative and not restrictive.

Figure 1A:
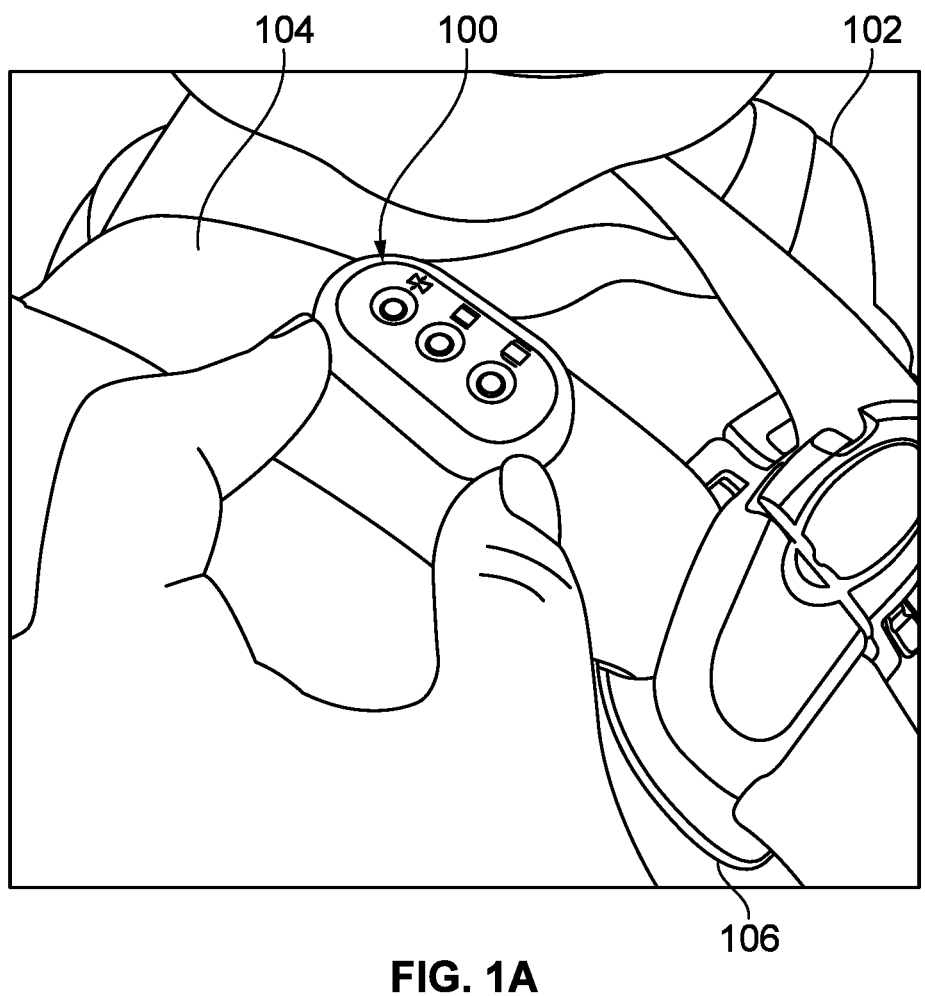
FIG. 1A shows a seatbelt strap sensor detachably fastened to a strap of a seatbelt in an automobile according to an embodiment of the present invention.

Referring to FIG. 1A, the seatbelt strap sensor 100 detachably fastened to a strap 104 of a seatbelt in an automobile is illustrated. In one embodiment, the seatbelt strap sensor 100 is fastened over the strap 104 of a child's car seat. The seatbelt strap sensor 100 could be turned on after fastened to the strap 104. In one embodiment, the seatbelt strap sensor 100 is configured to measure tightness or tension of the strap 104. The seatbelt strap sensor 100 has been designed to accurately measure the tightness of the straps 104 on the child's car seat to obtain the optimum tightness for the superlative safety of the child 102 while enhancing comfort.

Figure 1B:
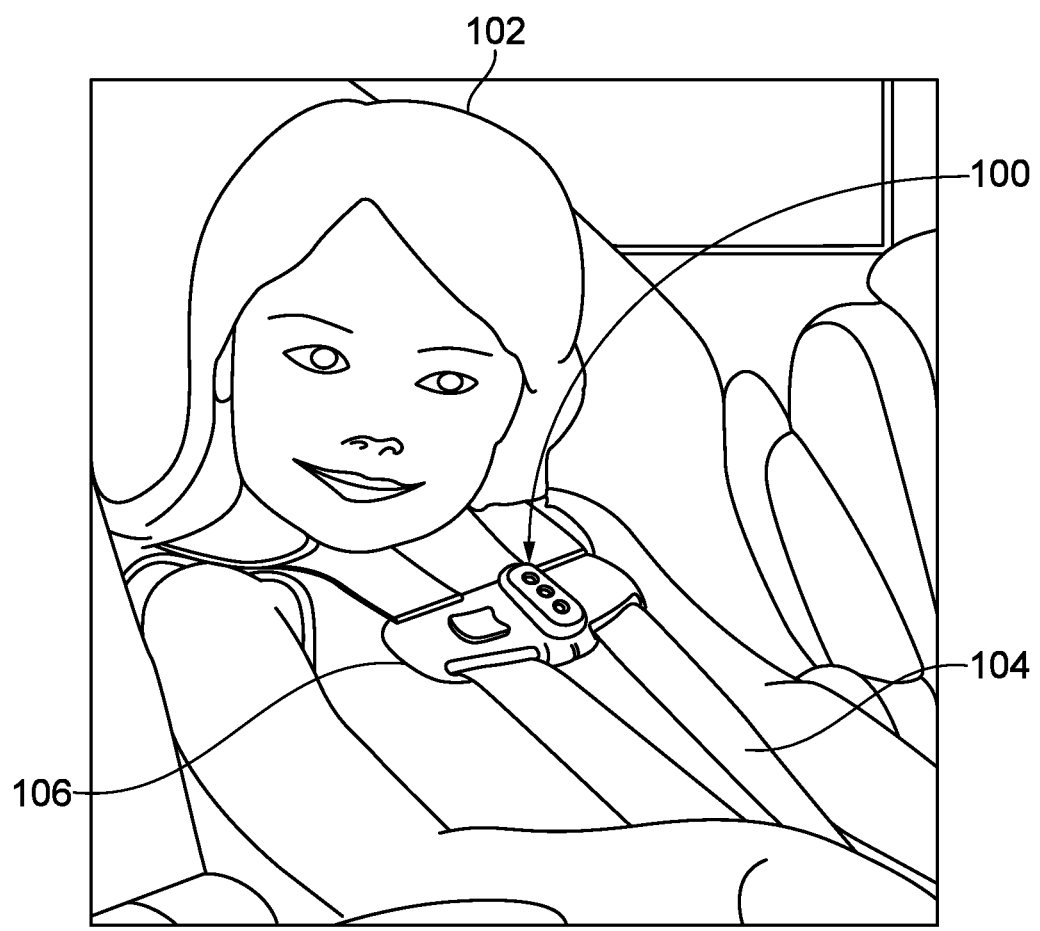
FIG. 1B shows a seatbelt strap sensor detachably fastened to a chest clamp of a seatbelt in an automobile according to another embodiment of the present invention.

Referring to FIG. 1B, the seatbelt strap sensor 100 detachably fastened to a chest clamp 106 of the seatbelt in an automobile is illustrated. In another embodiment, the seatbelt strap sensor 100 is fastened to a chest clamp 106. The chest clamp 106 prevents movements of the seatbelt strap sensor 100 while in running of the automobile or in an event of an impact. In one embodiment, the seatbelt strap sensor 100 measures the pressure against the child's chest and determines the optimum strap tightness or tension. In one embodiment, the seatbelt strap sensor 100 could guide the user and indicate whether the seatbelt is adjusted correctly by measuring the amount of tension applied to the seatbelt.

Figure 2A:
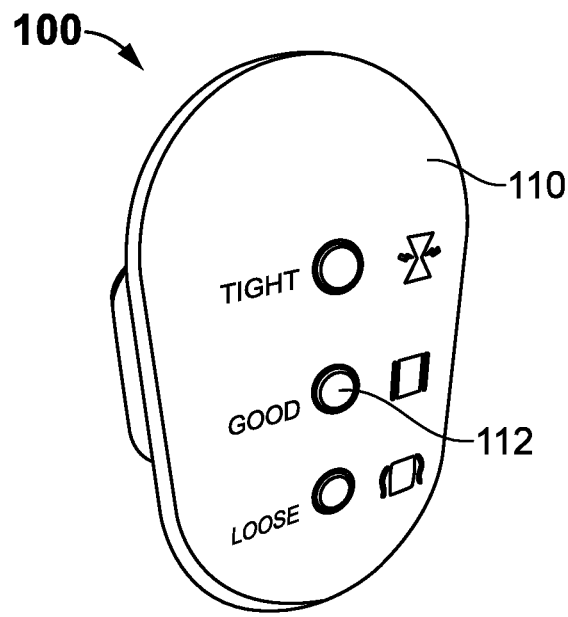
FIG. 2A shows a perspective front view of a seatbelt strap sensor according to an embodiment of the present invention.

Referring to FIG. 2A, the perspective front view of the seatbelt strap sensor 100 is illustrated. In one embodiment, the seatbelt strap sensor 100 comprises a body 110 and a plurality of light emitting diodes (LEDs) 112. In one embodiment, the housing 110 of the seatbelt strap sensor 100 is injection molded from, but not limited to, an acrylonitrile butadiene styrene (ABS) polycarbonate plastic. In one embodiment, the housing 110 is molded in two sections. In one embodiment, the two sections of the housing 110 are fastened via an adhesive. In another embodiment, the two sections of the housing 110 are fastened via a fastener. In one embodiment, the housing 110 comprises a front surface and a rear surface. The front surface could have one or more apertures to project the LEDs 112 out towards the front seat, which increases the visibility to users. In one embodiment, the housing 110 has smoothed edges to prevent injuries during the installation of the seatbelt strap sensor 100 or while using. The housing 110 could be durable, highly resistant to household chemicals and UV degradation, and is typically used in this type of application. In another embodiment, the housing 110 has single molded structure. In one embodiment, the fastener could be stainless-steel fasteners.

In one embodiment, the seatbelt strap sensor 100 further comprises a plurality of light emitting diodes (LEDs) 112. In one embodiment, the plurality of LEDs 112 having several colors configured to deliver information to the user on the tightness of the strap 104 (shown in FIG. 1A). In one embodiment, the colors of the plurality of LEDs 112 could be, but not limited to, an amber, a green, and a red color. In one embodiment, the plurality of LEDs 112 is disposed within the housing 110 of the seatbelt strap sensor 100. In one embodiment, the plurality of LEDs 112 is arranged in each corresponding position as depicted in FIG. 2A. In another embodiment, the plurality of LEDs 112 could be positioned in a row within the housing 110 of the seatbelt strap sensor 100. The plurality of LEDs 112 consumes low power and illuminate high light output to improve visibility to users.

Figure 2B:
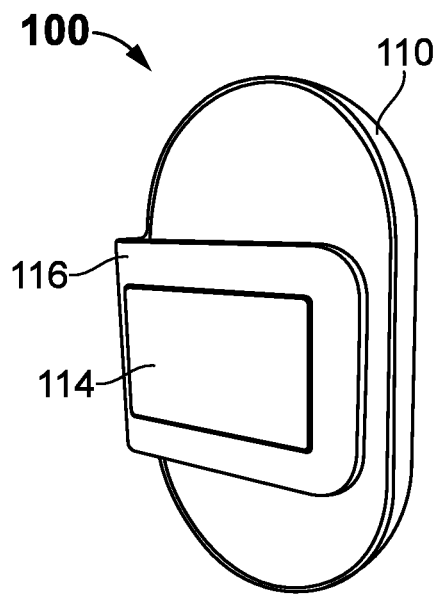
FIG. 2B shows a perspective rear view of a seatbelt strap sensor according to an embodiment of the present invention.

Referring to the FIG. 2B, the perspective rear view of the seatbelt strap sensor 100 is illustrated. In one embodiment, the seatbelt strap sensor 100 comprises a pressure sensor or metal foil strain gauge 114 and a bracket 116 mounted on the rear surface of the housing 110. In one embodiment, the pressure sensor 114 could be disposed on the surface of the bracket 116. The pressure sensor 114 is positioned against the body of the child 102. In one embodiment, the pressure sensor 114 is configured to measure the tightness or tension of the strap 104 (shown in FIG. 1A) of the seatbelt. The pressure sensor 114 is durable and is inexpensive, making it a good choice for this application.

In one embodiment, the bracket 116 is disposed at the one side of the housing 110 via, but not limited to, an adhesive or any other fastener. The bracket 116 extending longitudinally from the periphery of the housing 110 as depicted in FIG. 2B. In one embodiment, the bracket 116 is configured to tightly hold the seatbelt strap sensor 100 to the strap 104 (shown in FIG. 1A). The bracket 116 is capable to resists outward movements. In one embodiment, the bracket 116 could be, but not limited to, a clamp, and a clip.

Figure 2C:
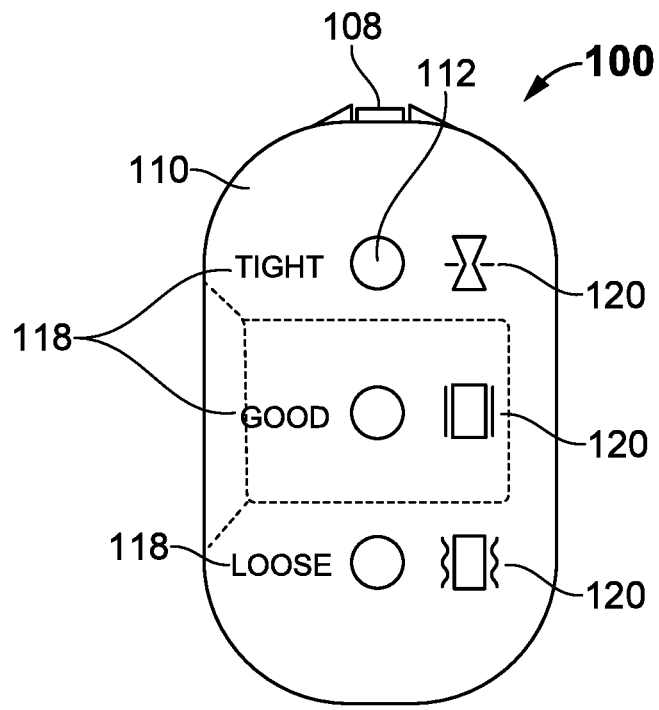
FIG. 2C shows a front view of a seatbelt strap sensor according to an embodiment of the present invention.

Referring to the FIG. 2C, the front view of a seatbelt strap sensor 100 is illustrated. In one embodiment, the plurality of LEDs 112 delivers information to the user on the tightness of the strap 104 (shown in FIG. 1A). The LEDs 112 are configured to illuminate different colors for indicating the tightness or tension of the strap 104 (shown in FIG. 1A) based on the output of the pressure sensor 114 (shown in FIG. 2B). In one embodiment, the housing 110 having indications with letters or words 118 and symbols 120 with corresponding to the LEDs 112. In one embodiment, the letters or words 118 and symbols 120 are screen printed on the front surface of the housing 110 and helps users to determine the tightness or tension of the strap 104 (shown in FIG. 1A) of the seatbelt. In an exemplary embodiment, if the tightness or tension of the strap 104 (shown in FIG. 1A) is low, one of the LED will illuminate in the red color to indicate insufficient tightness. If the tightness or tension of the strap 104 (shown in FIG. 1A) is high, another LED will illuminate in the amber color to indicate excessive tightness. If the tightness or tension of the strap 104 (shown in FIG. 1A) is enough, another LED will illuminate in the green color to indicate good tightness. The plurality of LEDs 112 alerts the user by turning on the appropriate LED based on the tightness or tension of the strap 104.

Figure 2D:
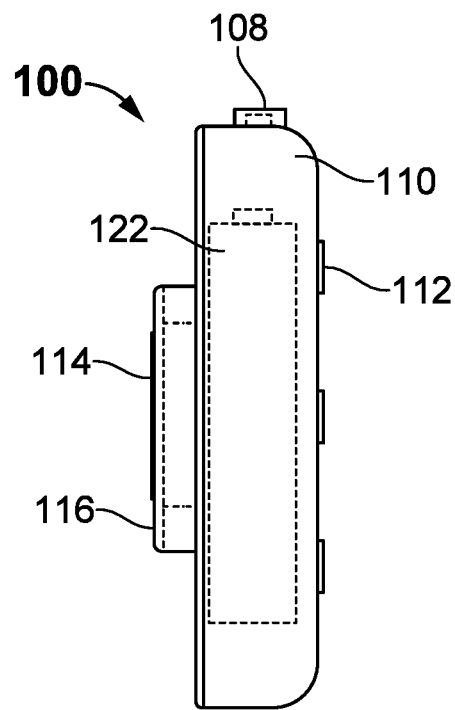
FIG. 2D shows a side view of a seatbelt strap sensor according to an embodiment of the present invention.

Referring to FIG. 2D, the side view of the seatbelt strap sensor 100 is illustrated. In one embodiment, the seatbelt strap sensor 100 further comprises at least one power source 122. In one embodiment, the power source 122 is disposed within the housing 110. The power source 122 is configured to power the LEDs 112 and electronic components, which are disposed within the housing 110 of the seatbelt strap sensor 100. In one embodiment, the power source 122 could be a battery, a fuel cell, and a solar cell. In one embodiment, the power source 122 could be placed inside the housing 110 via an access provided at the bottom of the housing 110.

Figure 3:
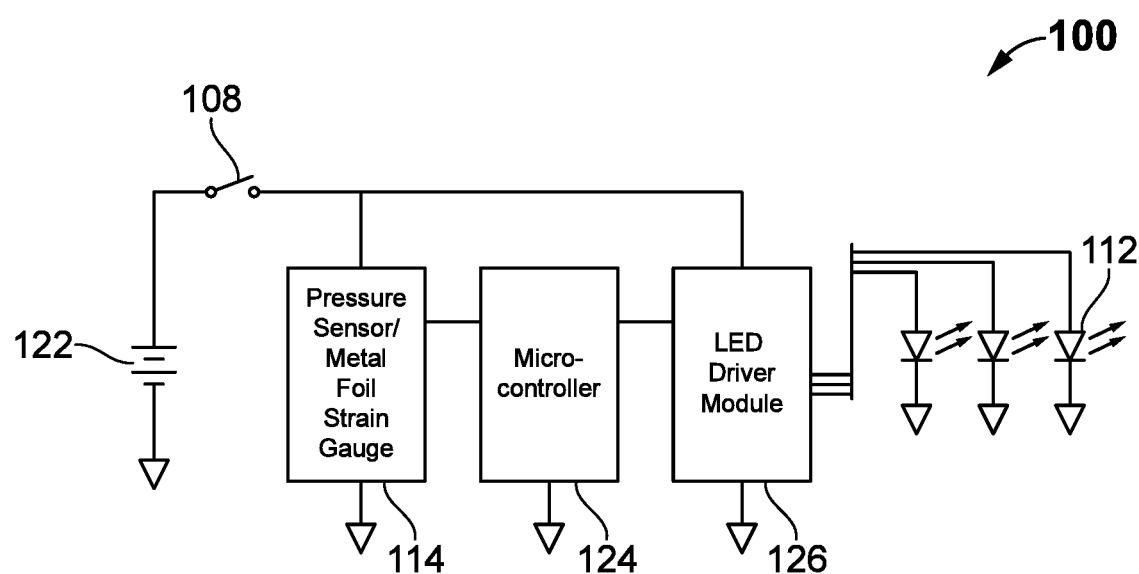
FIG. 3 shows a block diagram of an electronic circuit of the seatbelt strap sensor according to an embodiment of the present invention.

Referring to FIG. 3, the block diagram of an electronic circuit of the seatbelt strap sensor 100 is illustrated. In one embodiment, the electronic circuit of the seatbelt strap sensor 100 comprises the plurality of LEDs 112, the pressure sensor 114, a microcontroller 124, a LED driver module 126, at least one power source 122 and a switch 108. In one embodiment, the switch 108 is configured to switch from ON to OFF state and vice versa. In one embodiment, the LED driver module 126 is configured to drive power to the plurality of LEDs 112 within the circuit.

In one embodiment, the power source 122 is electrically coupled to the pressure sensor 114 and the LED driver module 126 via the switch 108. The output of the pressure sensor 114 is directly communicated to the microcontroller 124. Further, the output of the microcontroller 124 is communicated to the LED driver module 126. The output of the LED driver module 126 is communicated to the plurality of the LEDs 112 as depicted in FIG. 3.

In operation, when the switch 108 is in closed position, the power source 122 could supply power to the electronic components within the circuit. After, the pressure sensor 114 measure the tightness or tension applied to the strap 104 of the seatbelt and could deliver electrical signals to the microcontroller 124. The microcontroller 124 converts the electrical signals into digital signals or PWM output. The output of the microcontroller 124 is delivered to the LED driver module 126. Then, the LED driver module 126 controls the plurality of LEDs 112 with respect to the microcontroller 124 outputs.

In one embodiment, a printed circuit board (PCB) for the seatbelt strap sensor 100 is fabricated to the final assembler's requirements. The standard thickness, double sided FR4 circuit board material is populated with surface mounted components where possible. Any through-hole components are inserted after the surface mounted assembly, soldering, and cleaning. The circuit board is designed to have all the components oriented so they can be mounted with the LED illuminators projecting out of the lenses mounted in the housings. After assembly, the PCBs are protected with a moisture adsorption preventive conformal coating.

Figure 4:
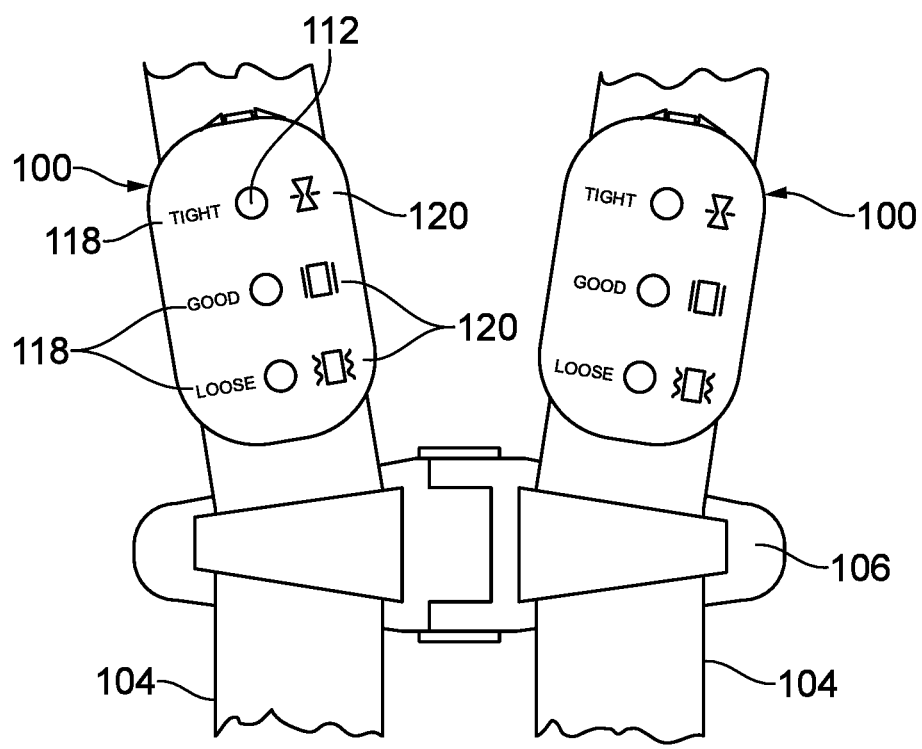
FIG. 4 shows a perspective view of a seatbelt strap sensor fastened to straps of the seatbelt of the automobile in another embodiment of the present invention.

Referring to FIG. 4, the perspective view of a seatbelt strap sensor 100 fastened to straps 104 of the seatbelt of the automobile is illustrated. In another embodiment, the seatbelt strap sensor 100 could be fastened to the plurality of straps 104 for accurately adjusting the tension or tightness of the straps 104 and to provide more comfort to the child 102. In one embodiment, the seatbelt strap sensor 100 could be left on to verify the strap tightness or tension. In one embodiment, the user could be turned off the seatbelt strap sensor 100 to conserve the power source 122 after the tightness or tension of the strap 104 is adjusted. Using two seatbelt strap sensors 100 to measure the tightness or tension, could be optimized for the comfort and safety of the child 102.

The seatbelt strap sensor 100 designed to be aesthetic and effective in the application. The relative ease of manufacture and the moderately inexpensive components provide good marketability for the manufacturer. The seatbelt strap sensor 100 in automobiles for providing safety to the children and resolves most of the problems by accurately measuring the tightness or tension of the strap 104. The seatbelt strap sensor 100 allows parents or a caregiver to optimally adjust the strap 104 of the seatbelts. The seatbelt strap sensor 100 accurately indicates the tightness or tension of the strap 104 and in order to limit the movements of the body in the event of impact and avoid personal injury resulting from automobile accidents. The seatbelt strap sensor 100 will operate about a few days on one set of power sources 122 (shown in FIG. 2D) under normal operation.

Preferred embodiments of this invention are described herein, including the best mode known to the inventors for carrying out the invention. It should be understood that the illustrated embodiments are exemplary only and should not be taken as limiting the scope of the invention.

The foregoing description comprise illustrative embodiments of the present invention. Having thus described exemplary embodiments of the present invention, it should be noted by those skilled in the art that the within disclosures are exemplary only, and that various other alternatives, adaptations, and modifications may be made within the scope of the present invention. Merely listing or numbering the steps of a method in a certain order does not constitute any limitation on the order of the steps of that method. Many modifications and other embodiments of the invention will come to mind to one skilled in the art to which this invention pertains having the benefit of the teachings in the foregoing descriptions. Although specific terms may be employed herein, they are used only in generic and descriptive sense and not for purposes of limitation. Accordingly, the present invention is not limited to the specific embodiments illustrated herein.

What is claimed is:

1. A seatbelt strap sensor for attachment to a strap of a seatbelt in an automobile, comprises:
   a housing comprises a front surface and a rear surface;
   a plurality of light emitting diodes (LEDs) disposed within the housing, wherein the housing allows the LEDs to project outwards via one or more apertures on the front surface;
   a bracket mounted on the rear surface of the housing, and
   a pressure sensor mounted on the surface of the bracket, wherein the pressure sensor is configured to measure the tightness or tension of the strap of the seatbelt.

2. The seatbelt strap sensor of claim 1, wherein the plurality of LEDs having one or more colors, configured to illuminate any one of the LED color, thereby delivering the information on the tightness or tension of the strap to the user.

3. The seatbelt strap sensor of claim 2, wherein the illumination of the LED color is based on the sensor measurement on the tightness or tension of the strap.

4. The seatbelt strap sensor of claim 1, wherein the plurality of LEDs are an amber, a green and a red color.

5. The seatbelt strap sensor of claim 1, wherein the bracket slips under the strap to avoid the slippage of seatbelt strap sensor from the strap of the seatbelt during use.

6. The seatbelt strap sensor of claim 1, wherein the seatbelt strap sensor mounted on a chest clamp of the seatbelt, via the bracket.

7. The seatbelt strap sensor of claim 1, wherein the housing of the seatbelt strap sensor is injection molded from an acrylonitrile butadiene styrene (ABS) polycarbonate plastic.

8. The seatbelt strap sensor of claim 1, wherein the pressure sensor is a metal foil stain gauge.

9. The seatbelt strap sensor of claim 1, wherein the bracket is mounted on the rear side of the sensor, via any one of an adhesive or a fastener.

10. The seatbelt sensor of claim 1, wherein the bracket is a clamp and a clip.

11. A seatbelt strap sensor, comprising:
    a housing comprises a front surface and a rear surface, and
    a plurality of electronic components, comprises:
       a plurality of light emitting diodes (LEDs) disposed within the housing, wherein the housing allows the LEDs to project outwards via one or more apertures on the front surface;
       a pressure sensor mounted on the surface of a bracket mounted on the rear side of the housing, to measure the tightness or tension of the strap of the seatbelt, thereby generating an electrical signal;
       a microcontroller in communication with the pressure sensor, wherein the microcontroller processes the electrical signal received from the pressure sensor, thereby generating an output signal, and
       a LED drive module in communication with the microcontroller, wherein the LED drive module receives the output signal of the microcontroller, thereby controlling the plurality of LEDs.

12. The seatbelt strap sensor of claim 11, wherein the output signal of the microcontroller is at least any one of a digital signal or a pulse-width modulation signal.

13. The seatbelt strap sensor of claim 11, further comprises at least one power source disposed within the housing configured to power the plurality of LEDs and one or more electronic components disposed within the housing.

14. The seatbelt strap sensor of claim 11, further comprises a switch for the power source.

15. The seatbelt strap sensor of claim 11, wherein the power source is at least any one of a battery, a fuel cell, and a solar cell.

* * * * *